(12) United States Patent
Haraguchi

(10) Patent No.: US 11,554,732 B2
(45) Date of Patent: Jan. 17, 2023

(54) ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 53 days.

(21) Appl. No.: 17/261,296

(22) PCT Filed: Jul. 10, 2019

(86) PCT No.: PCT/JP2019/027334
§ 371 (c)(1),
(2) Date: Jan. 19, 2021

(87) PCT Pub. No.: WO2020/026736
PCT Pub. Date: Feb. 6, 2020

(65) Prior Publication Data
US 2021/0347317 A1    Nov. 11, 2021

(30) Foreign Application Priority Data

Jul. 31, 2018  (JP) .............................. JP2018-144348

(51) Int. Cl.
*H05K 1/02* (2006.01)
*B60R 16/023* (2006.01)
(Continued)

(52) U.S. Cl.
CPC ....... *B60R 16/0239* (2013.01); *H05K 1/0213* (2013.01); *H05K 1/181* (2013.01);
(Continued)

(58) Field of Classification Search
CPC .... H05K 1/18; H05K 1/181–188; H05K 1/02; H05K 1/0213; H05K 7/06;
(Continued)

(56) References Cited

U.S. PATENT DOCUMENTS 7,167,377 B2 * 1/2007 Onizuka ................ H05K 7/026
361/772
7,632,110 B2 * 12/2009 Kanou ................... H02G 3/086
439/949
(Continued)

FOREIGN PATENT DOCUMENTS

JP    H9-321395 A    12/1997
JP    2018-107284 A    7/2018

OTHER PUBLICATIONS

International Search Report, Application No. PCT/JP2019/027334, dated Aug. 20, 2020. ISA/Japan Patent Office.

*Primary Examiner* — Tuan T Dinh
(74) *Attorney, Agent, or Firm* — Honigman LLP

(57) ABSTRACT

An electrical junction box including: bus bars; a circuit board of which one side opposes the bus bars; a conductive portion that is provided on the one side of the circuit board, and is exposed from the other side of the circuit board; an opening that is provided in parallel with the conductive portion in the circuit board, and from which a portion of the bus bars is exposed; a switching element that is arranged on the other side of the circuit board, and of which an input terminal or an output terminal is connected to the conductive portion; and a conductive piece that is arranged straddling a portion of the bus bars and the conductive portion.

8 Claims, 8 Drawing Sheets

(51) Int. Cl.
  *H05K 1/18*    (2006.01)
  *H05K 7/06*    (2006.01)
(52) U.S. Cl.
  CPC ..... *H05K 7/06* (2013.01); *H05K 2201/10053* (2013.01); *H05K 2201/10166* (2013.01); *H05K 2201/10272* (2013.01)
(58) Field of Classification Search
  CPC .......... H05K 2201/10053; H05K 2201/10166; H05K 2201/10272
  USPC .......... 361/774–778, 813; 439/61, 76.2, 404, 439/876; 257/690–692
  See application file for complete search history.

(56) References Cited

U.S. PATENT DOCUMENTS

| | | | |
|---|---|---|---|
| 9,635,754 B2* | 4/2017 | Nakamura | H05K 1/115 |
| 9,949,363 B2* | 4/2018 | Nakamura | H05K 1/181 |
| 10,806,034 B2* | 10/2020 | Kita | H05K 1/181 |
| 2017/0006703 A1* | 1/2017 | Haraguchi | H05K 1/18 |
| 2017/0149222 A1* | 5/2017 | Kobayashi | H05K 1/115 |
| 2018/0368249 A1 | 12/2018 | Chin et al. | |
| 2019/0082527 A1 | 3/2019 | Kita | |
| 2019/0208617 A1* | 7/2019 | Kita | H05K 1/181 |

* cited by examiner

ELECTRICAL JUNCTION BOX

CROSS-REFERENCE TO RELATED APPLICATIONS

This application is the U.S. national stage of PCT/JP2019/027334 filed on Jul. 10, 2019, which claims priority of Japanese Patent Application No. JP 2018-144348 filed on Jul. 31, 2018, the contents of which are incorporated herein.

TECHNICAL FIELD

The present disclosure relates to an electrical junction box.

BACKGROUND

Conventionally, electrical junction boxes are installed between power sources and loads in vehicles and control the flow of current from the power sources to the loads. Electrical junction boxes include a plurality of plate-shaped bus bars and switching elements that are connected to the bus bars.

Electrical junction boxes also include control circuits that switch the switching elements on and off. The switching elements are switched on or off based on signals that are input from the control circuits. The electrical junction boxes electrically connect and disconnect the bus bars by switching the switching element on and off, and thus perform the current control as described above.

FETs, for example, can be used as the switching elements. FETs include drain terminals and source terminals. The bus bars are spaced apart from each other and the terminals of the switching elements are individually connected to the bus bars (for example, see JP 9-321395A).

There are cases where it becomes difficult to provide bus bars with appropriate spacing therebetween as the FETs have been downsized and the spaces between terminals have become smaller. For this reason, there are cases where it is difficult to install a small FET on a bus bar.

An object of the present disclosure is to provide an electrical junction box in which it is possible to easily install a switching element.

SUMMARY

An electrical junction box according to an aspect of the present disclosure includes: bus bars; a circuit board of which one side opposes the bus bars; a conductive portion that is provided on the one side of the circuit board, and is exposed from the other side of the circuit board; an opening that is provided in parallel with the conductive portion in the circuit board, and from which a portion of the bus bars is exposed; a switching element that is arranged on the other side of the circuit board, and of which an input terminal or an output terminal is connected to the conductive portion; and a conductive piece that is arranged straddling a portion of the bus bars and the conductive portion.

EFFECT OF DISCLOSURE

With the configuration described above, it is possible to easily install a switching element.

DETAILED DESCRIPTION OF PREFERRED EMBODIMENTS

Figure 1:
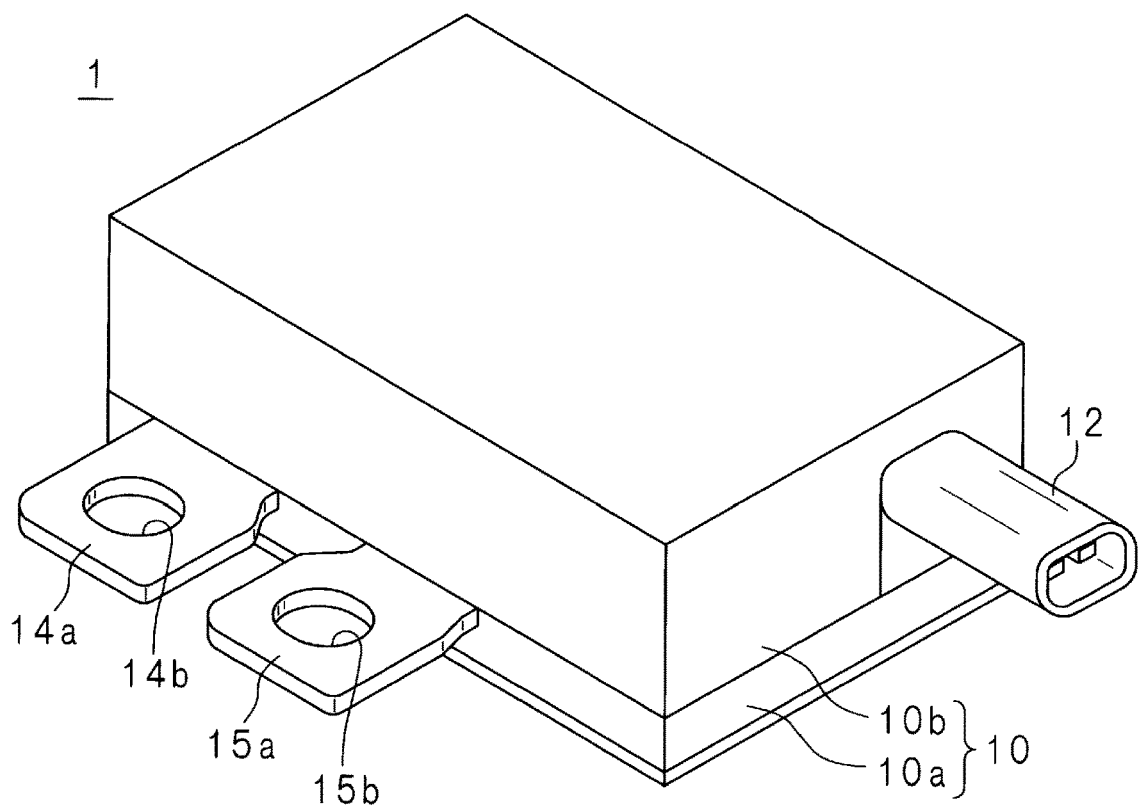
FIG. 1 is an external perspective view of an electrical junction box according to an embodiment.

Embodiments of the present disclosure will be listed and described. Also, at least some of the embodiments described below may also be freely combined.

An electrical junction box according to an aspect of the present disclosure includes: bus bars; a circuit board of which one side opposes the bus bars; a conductive portion that is provided on the one side of the circuit board, and is exposed from the other side of the circuit board; an opening that is provided in parallel with the conductive portion in the circuit board, and from which a portion of the bus bars is exposed; a switching element that is arranged on the other side of the circuit board, and of which an input terminal or an output terminal is connected to the conductive portion; and a conductive piece that is arranged straddling a portion of the bus bars and the conductive portion.

With this aspect, the input terminal and output terminal of the switching element electrically connect to the bus bars via the conductive portion and conductive piece of the circuit board. Accordingly, the terminals of the switching element can be connected to the bus bars without narrowing the space therebetween in relation to the spaces between the terminals of the switching element. Thus, the switching element can easily be installed in the electrical junction box even if the spaces between the terminals of the switching element are narrow. Accordingly, it is possible to easily install the switching element in the electrical junction box.

Also, using the conductive piece makes it possible to reduce the conduction distance to the conductive portion of the circuit board, and decrease the resistance value of the conduction path. Also, it is possible to increase thermal conductivity to the bus bar and to suppress localized increases in temperature.

The electrical junction box according to another aspect of the present disclosure is configured such that the conductive portion, the opening, and the conductive piece are each provided in pairs corresponding to the input terminal and the output terminal of the switching element; the bus bars include an input bus bar into which power can be input, and an output bus bar from which power can be output; the input terminal of the switching element is electrically connected to the input bus bar; and the output terminal of the switching element is electrically connected to the output bus bar.

With this aspect, the input terminal and the output terminal each electrically connect to the bus bars via the conductive portion and the conductive piece of the circuit board. Accordingly, it is possible to even more easily install the switching element in the electrical junction box.

The electrical junction box according to another aspect of the present disclosure further includes an adhesive sheet that is arranged between the circuit board and the bus bars, and that adheres the circuit board and the bus bars to each other.

With this aspect, heat generated by the switching element can be conducted towards the bus bars via the adhesive sheet.

The electrical junction box according to another aspect of the present disclosure is configured such that the conductive piece is connected to the portion of the bus bars and the conductive portion through soldering.

With this aspect, the bus bars and the conductive portion can be electrically connected with the solder and the conductive piece, and the conductive piece can be used to suppress cracking in the solder.

The following describes the present disclosure and embodiments thereof with reference to the drawings.

FIG. 1 is an external perspective view of an electrical junction box according to an embodiment. An electrical junction box 1 is provided on a power supply path between a power source such as a battery included in a vehicle, and a load such as a lamp, a wiper, or a motor.

The electrical junction box 1 includes a housing 10. The housing 10 has a rectangular parallelepiped shape, and includes a flat rectangular shaped body portion 10a and a cover portion 10b that completely covers one side of the body portion 10a.

Figure 2:
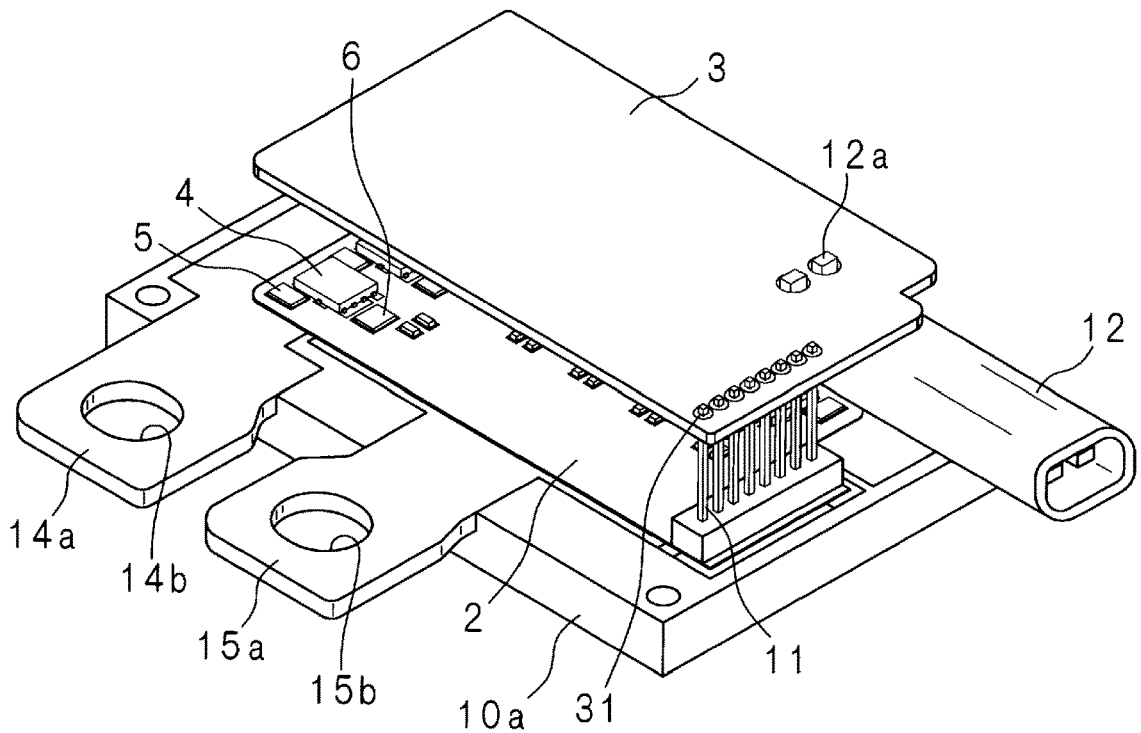
FIG. 2 is a perspective view of the electrical junction box showing a state in which a cover portion has been removed.

FIG. 2 is a perspective view of an electrical junction box 1 showing a state in which the cover portion 10b has been removed. The electrical junction box 1 includes a circuit board 2 and a control board 3. The circuit board 2 may be, for example, an FPC (Flexible Printed Circuit) or the like. The circuit board 2 is arranged with one surface opposing the body portion 10a and is mounted thereto. An electronic component such as an FET (Field Effect Transistor) that will be described later, a conductive piece, or the like is mounted on the circuit board 2.

The control board 3 has a rectangular plate shape and includes a surface that opposes the circuit board 2. The lengthwise direction of the control board 3 is parallel to the lengthwise direction of the circuit board 2. One side of the control board 3 is provided with electronic components such as resistors, coils, capacitors, diodes, or the like, and a control circuit (not shown) that includes a wiring pattern that electrically connects the electronic components.

One short-side portion of the circuit board 2 is provided with pole-shaped pin-and-socket connectors 11. The circuit board 2 is connected to the control board 3 via the pin-and-socket connectors 11.

A connector 12 has a tubular shape when viewed from the outside, and a plurality of pole-shaped terminal portions 12a are provided inside the connector 12. One end of the terminal portions 12a is connected to an external ECU (Electronic Control Unit) via a signal line (not shown). The other end of the terminal portion 12a of the connector 12 is connected to the wiring pattern of the control board 3. As shown in FIG. 1, the connector 12 protrudes from the cover portion 10b when the cover portion 10b is attached to the body portion 10a.

Figure 3:
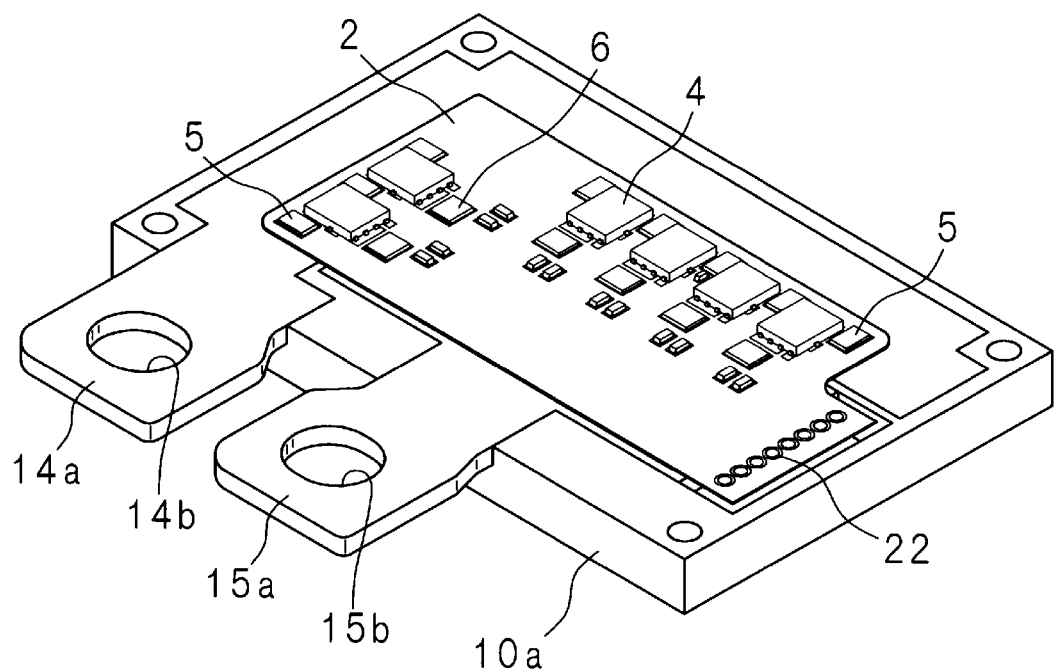
FIG. 3 is a perspective view showing FETs installed.

FIG. 3 is a perspective view showing FETs installed. The electrical junction box 1 includes a plurality of FETs 4 (six in the drawings), a plurality of first conductive pieces 5 (eight in the drawings), and a plurality of second conductive pieces 6 (six in the drawings). Note that the numbers of the FETs 4, the first conductive pieces 5, and the second conductive pieces 6 are not limited to the numbers thereof shown in the drawings.

Two FETs 4 are arranged on the other side of the circuit board 2 along the other short-side portion thereof that is opposite to the short-side portion described above, and four FETs 4 are provided parallel to each other along one long-side portion. One short-side portion of the circuit board 2 is provided with a plurality of parallel through holes 22 to which the pin-and-socket connectors 11 connect.

The first conductive pieces 5 are arranged so as to sandwich the FETs 4, with three of the first conductive pieces 5 arranged along the other short-side portion of the circuit board 2, and five of the first conductive pieces 5 arranged along the one long-side portion of the circuit board 2. Two of the second conductive pieces 6 are arranged along the other short-side portion of the circuit board 2, and four of the second conductive pieces 6 are arranged along one long-side portion of the circuit board 2. Each of the second conductive pieces 6 corresponds to a different FET 4 and is positioned more towards the center of the circuit board 2 than the FETs 4 are. A plurality of chip components are arranged in the periphery of the second conductive pieces 6. The first conductive pieces 5 and the second conductive pieces 6 are preferably chip-shaped pieces of copper having excellent electrical conductivity and thermal conductivity.

Figure 4:
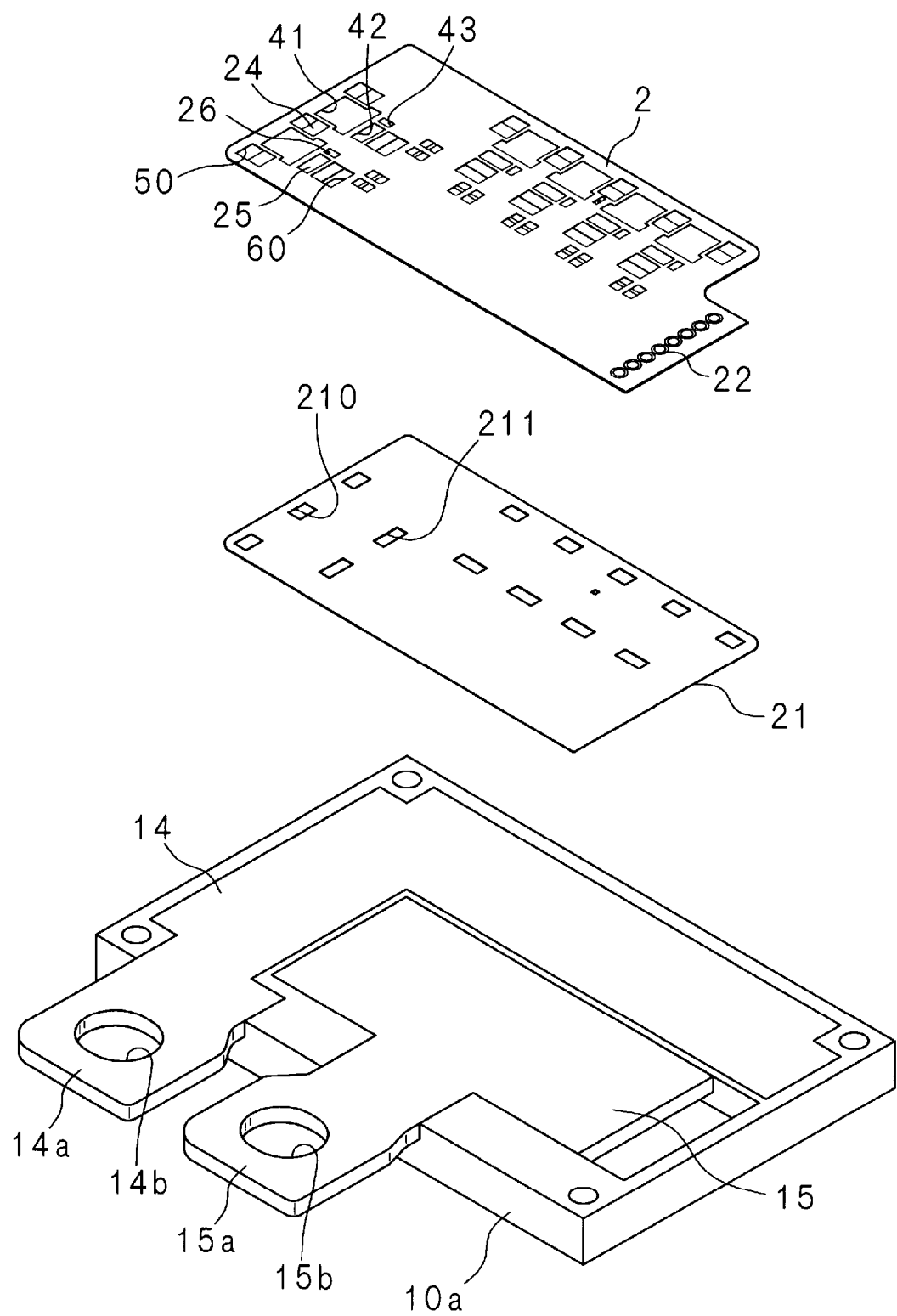
FIG. 4 is a perspective view showing a state in which a circuit board is not mounted.
Figure 5:
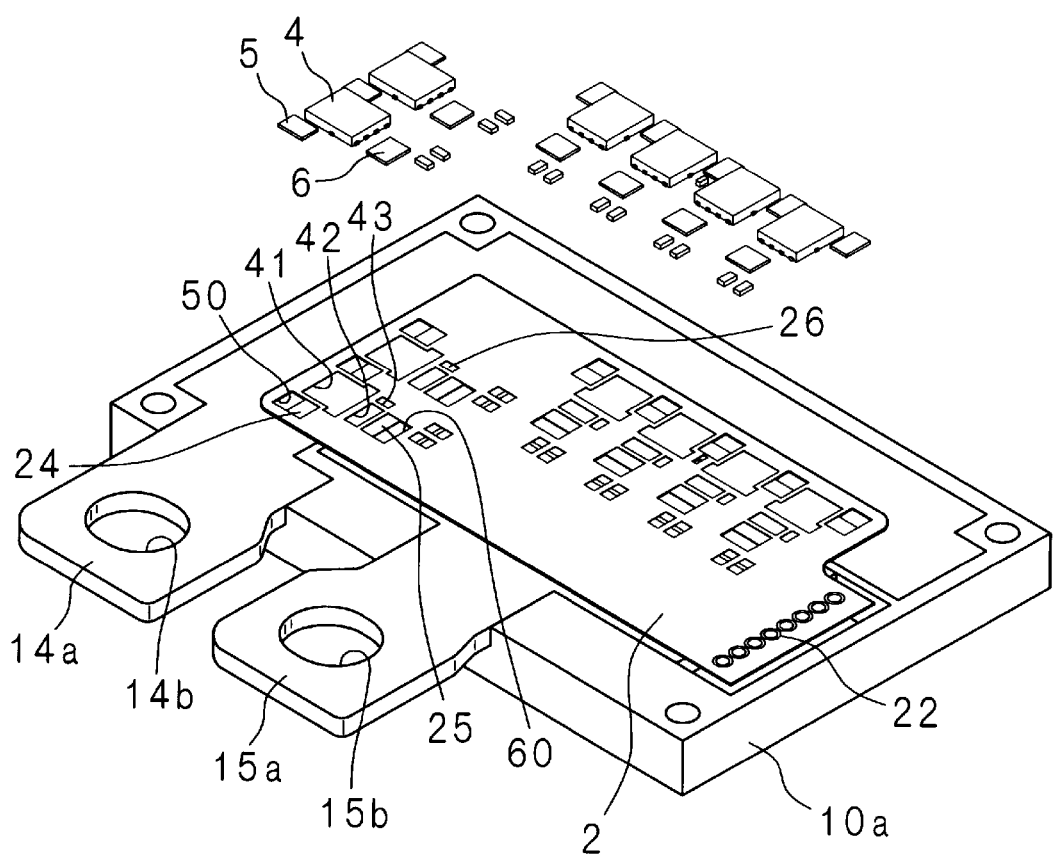
FIG. 5 is a perspective view illustrating how the FETs are installed.
Figure 6:
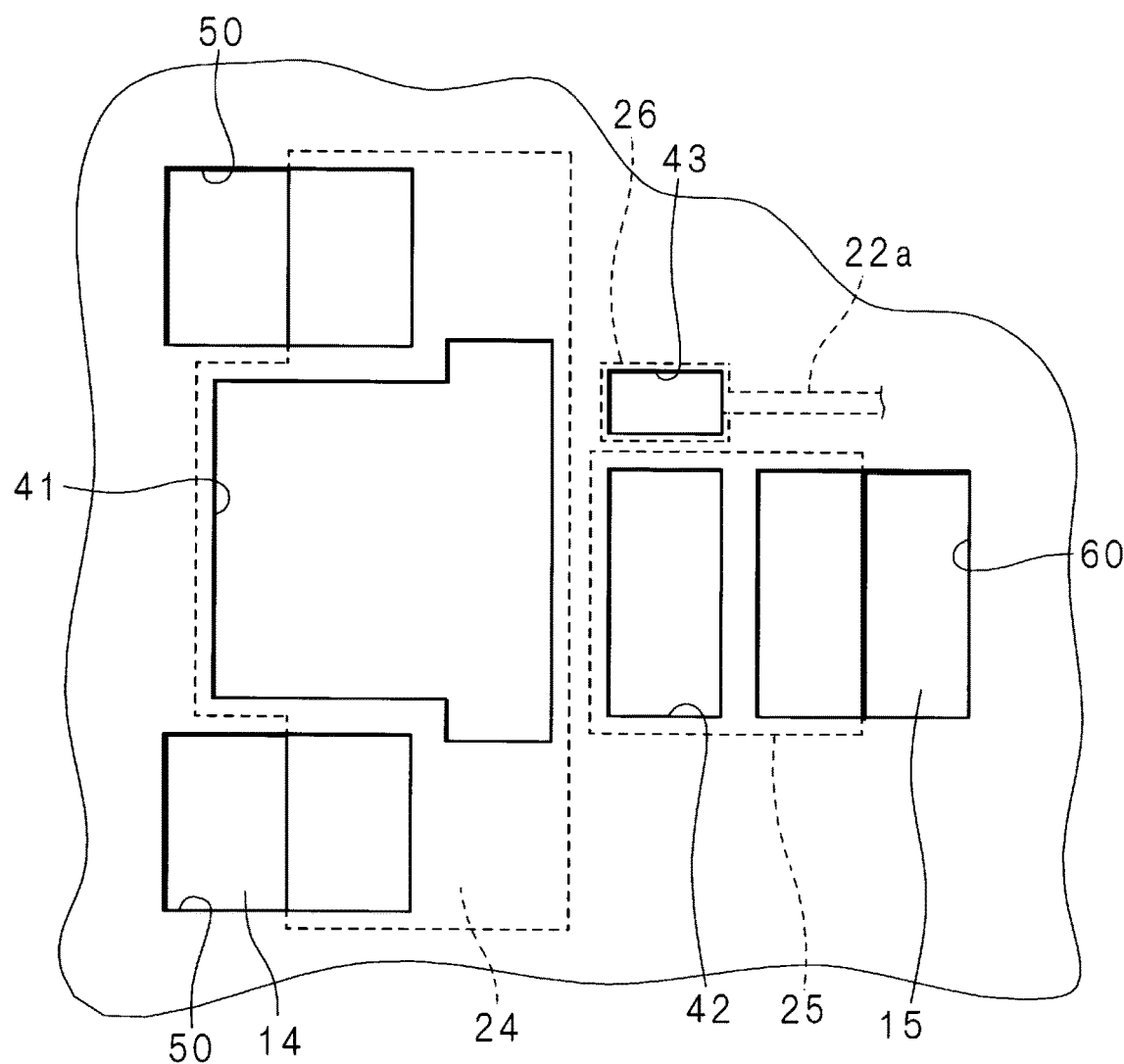
FIG. 6 is a partially enlarged plan view showing a first conductive portion and a second conductive portion.

FIG. 4 is a perspective view showing a state in which the circuit board 2 is not mounted. FIG. 5 is a perspective view illustrating the mounting of the FETs 4. FIG. 6 is a partially enlarged plan view showing a first conductive portion and a second conductive portion.

As shown in FIG. 4, one side of the body portion 10a is provided with a plate-shaped input bus bar 14 and a plate-shaped output bus bar 15, which are flush with each other. The input bus bar 14 is shaped like the letter "L" in a planar view thereof, and the straight portions of the "L" shape are positioned along a long-side portion and a short-side portion of the body portion 10a. One end portion of the input bus bar 14 is continuous with an input terminal 14a, which protrudes from the body portion 10a.

The output bus bar 15 has a rectangular shape and is arranged in a central portion of one side of the body portion 10a. The output bus bar 15 is separated from the input bus bar 14 by a predetermined distance, such that the lengthwise direction of the output bus bar 15 is parallel with the lengthwise direction of the body portion 10a. The output bus bar 15 is continuous with an output terminal 15a that is provided in a central portion of the output bus bar 15 in the lengthwise direction thereof, and protrudes from the body portion 10a.

The input bus bar 14 and the output bus bar 15, as well as the input terminal 14a and the output terminal 15a, have a plate thickness of 2 mm and are formed by bus bar members whose surface layer has been subjected to nickel plating.

Holes 14b and 15b are respectively provided passing through the input terminal 14a and the output terminal 15a in the thickness direction thereof, and the power source and the load are connected to each other by bolts (not shown) that are inserted into the holes 14b and 15b. The input terminal 14a can be connected to the power source, and the output terminal 15a can be connected to the load.

The body portion 10a is insert-molded with the use of an insulating resin material such as, for example, a phenol resin, a glass epoxy resin, or the like. A resin molded body is molded from an insulating resin material and is bonded to the input terminal 14a, the output terminal 15a, the input bus bar 14, and the output bus bar 15 to create a single body. Also, the resin molded body is arranged between the input terminal 14a and the output terminal 15a, as well as between the input bus bar 14 and the output bus bar 15, and provides insulation therebetween.

Also, the circuit board 2 is adhered to the body portion 10a by an insulating adhesive sheet 21 that has high thermal conductivity and has a rectangular shape as shown in FIG. 4.

First openings 41, second openings 42, and third openings 43 are provided passing through the circuit board 2 at positions corresponding to the FETs 4. The second openings 42 and the third openings 43 are positioned more towards the center of the circuit board 2 than the first openings 41 are, and are lined up along the lengthwise direction and the widthwise direction of the circuit board 2. The first openings 41 are larger than the second openings 42 and the third openings 43, and the second openings 42 are larger than the third openings 43.

Also, fourth openings 50 are provided passing through the circuit board 2 at positions corresponding to the first conductive pieces 5. Furthermore, fifth openings 60 are provided passing through the circuit board 2 at positions corresponding to the second conductive pieces 6. The fifth openings 60 and the first openings 41 are positioned sandwiching the second openings 42.

One side of the circuit board 2 is provided with rectangular first conductive portions 24 at positions corresponding to the first openings 41 and the fourth openings 50. The first conductive portions 24 are exposed on the other side of the circuit board 2 from the whole of the first openings 41 and are exposed on the other side of the circuit board 2 from the halves of the fourth openings 50 that are located towards the center of the circuit board 2. Note that if exposed in the manner described above, the first conductive portions may also be shaped like the letter "L" corresponding to all of the first openings 41 and the fourth openings 50, or may also be provided for each of the first openings 41 and the fourth openings 50.

The circuit board 2 is provided with rectangular second conductive portions 25 at positions corresponding to the second openings 42 and the fifth openings 60. The second conductive portions 25 are exposed on the other side of the circuit board 2 from the whole of the second openings 42 and are exposed on the other side of the circuit board 2 from the halves of the fifth openings 60 that are located towards the outer side of the circuit board 2. Furthermore, one side of the circuit board 2 is provided with land portions 26 at positions corresponding to the third openings 43, and these land portions 26 are exposed on the other side of the circuit board 2 from the whole of the third openings 43. Also, one surface of the circuit board 2 is provided with connection portions 22a that electrically connect the land portions 26 and the through holes 22. The first conductive portions 24, the second conductive portions 25, the land portions 26, and the connection portions 22a may be formed from a copper foil, for example.

First holes 210 and second holes 211 are provided passing through the adhesive sheet 21 at positions corresponding to the fourth openings 50 and the fifth openings 60 of the circuit board 2. The first holes 210 correspond to the half of the fourth openings 50 that are located towards the outer side of the circuit board 2, and the second holes 211 correspond to the half of the fifth openings 60 that are located towards the center of the circuit board 2.

The circuit board 2 and the adhesive sheet 21 are superimposed over one side of the body portion 10a such that the one side provided with the circuit pattern of the circuit board 2 including the first conductive portions 24, the second conductive portions 25, the land portions 26, and the connection portions 22a is positioned towards the adhesive sheet 21. The first holes 210 are continuous with the fourth openings 50, and do not overlap the first conductive portions 24. Also, the second holes 211 are continuous with the fifth openings 60, and do not overlap the second conductive portions 25.

As shown in FIG. 6, portions of the input bus bar 14 are exposed from the fourth openings 50 and the first holes 210, and portions of the output bus bar 15 are exposed from the fifth openings 60 and the second holes 211.

For the circuit board 2, a polyimide or the like is used as a base material and is provided with a pattern that includes the conductive portions and the like, formed on one side through etching and has an insulating cover film attached thereto. A 35 μm copper foil, for example, may be used as the first conductive portions 24, the second conductive portions 25, the land portions 26, and the connection portions 22a. The conductive pieces may be made of pure copper or a copper alloy having a thickness of 0.2 to 0.5 mm, for example, and the surfaces of the conductive pieces may be plated with tin, nickel, or the like.

Figure 7:
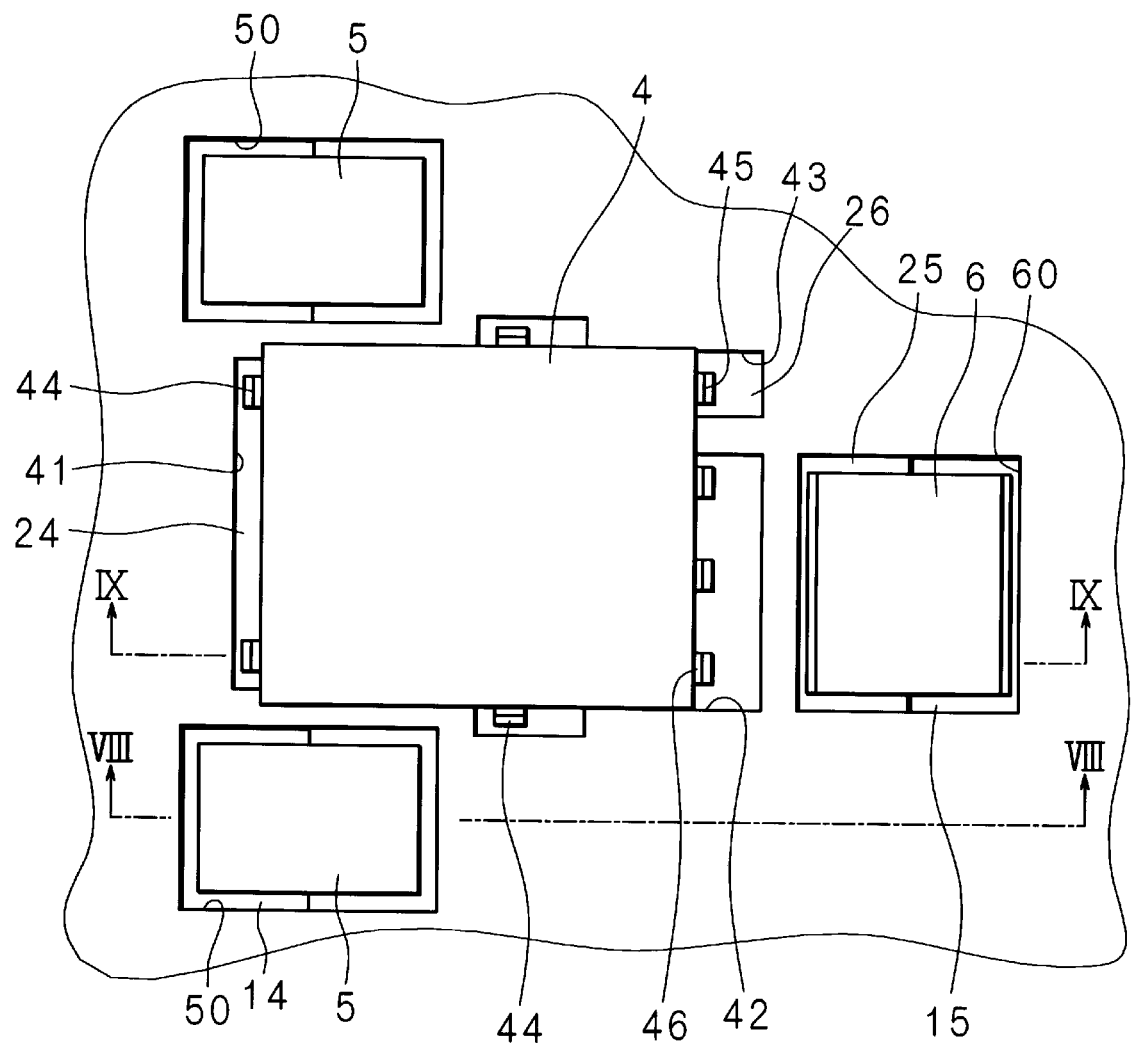
FIG. 7 is a partially enlarged plan view showing the FETs installed.
Figure 8:
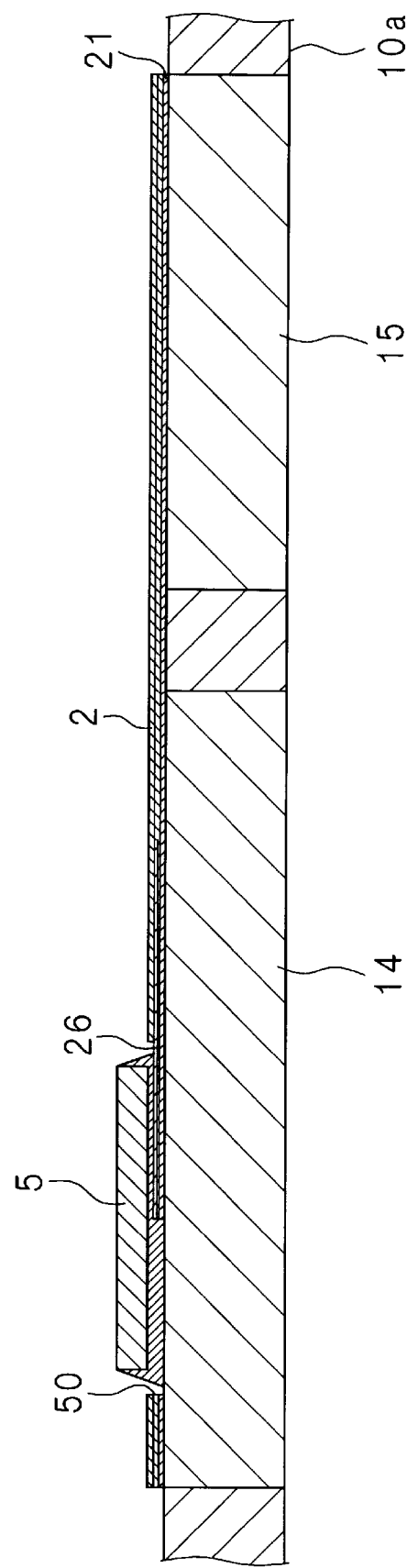
FIG. 8 is a sectional view taken along a line VIII-VIII in FIG. 7.
Figure 9:
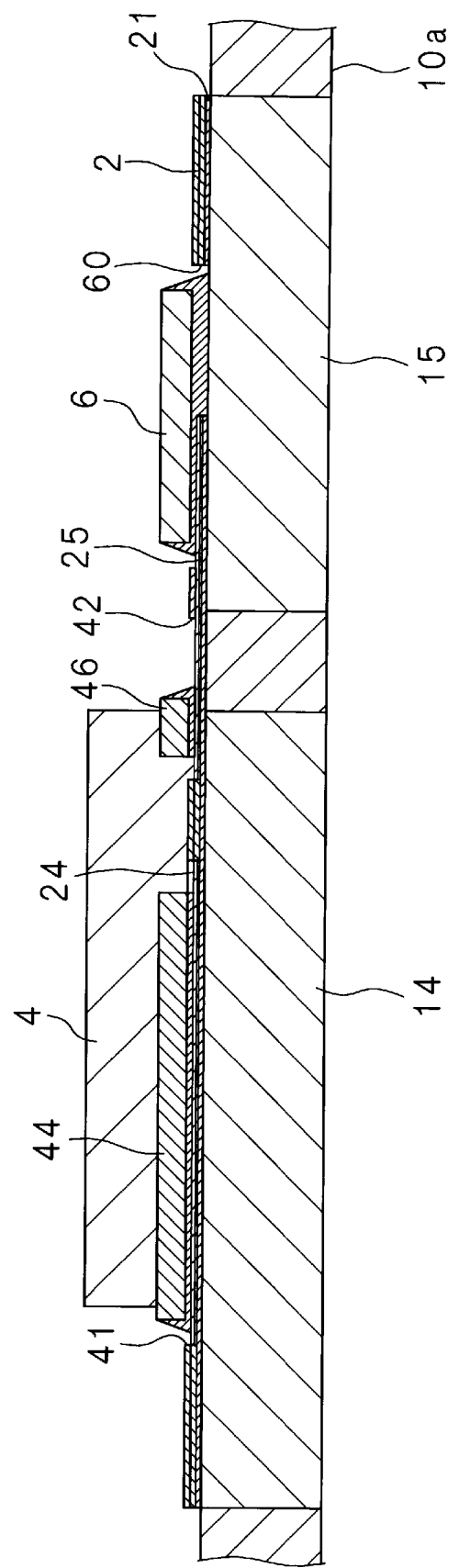
FIG. 9 is a sectional view taken along a line IX-IX in FIG. 7.

FIG. 7 is a partially enlarged plan view showing the FETs 4 installed. FIG. 8 is a sectional view taken along a line VIII-VIII in FIG. 7. FIG. 9 is a sectional view taken along a line IX-IX in FIG. 7. Each FET 4 has a rectangular parallelepiped shape and includes four drain terminals 44 that protrude from one side wall and the two side walls that are continuous with the one side wall, and one gate terminal 45 and three source terminals 46 that protrude from a side wall opposite to the one side wall.

The FETs 4 are arranged straddling the first openings 41 to the third openings 43. The drain terminals 44 are soldered to the first conductive portions 24 in the first openings 41, the gate terminals 45 are soldered to the land portions 26 in the third openings 43, and the source terminals 46 are soldered to the second conductive portions 25 in the second openings 42.

The first conductive pieces 5 are arranged straddling the input bus bar 14 and the first conductive portions 24 in the fourth openings 50, all of which are connected to each other through soldering. The second conductive pieces 6 are arranged straddling the output bus bar 15 and the second conductive portions 25 in the fifth openings 60, all of which are connected to each other through soldering.

A soldering paste, for example, may be applied to the first conductive portions 24 and the second conductive portions 25 to arrange and mount the FETs 4, the first conductive pieces 5, and the second conductive pieces 6 with the use of reflow soldering.

Here, it is preferable that the adhesive sheet 21, for example, contains a thermally conductive filler and an adhesive is used that is highly resistant to heat, such as an acrylic or silicone adhesive, or the like. In this way, heat generated by the FETs 4 can be transmitted and dissipated to a bus bar, and it is also possible to increase the heat resistance of the adhesive sheet 21 during reflow soldering.

With the configuration described above, the gate terminals 45 of the FETs 4 are connected to the control board 3 via the land portions 26, the connection portions 22a, the through holes 22, and the pin-and-socket connectors 11. Thus, signals from the control board 3 and based on signals from an external ECU are input into the FETs 4. The FETs 4 are switched on and off based on the signals from the control board 3. The drain terminals 44 and the source terminals 46 are brought into conduction and the FETs 4 are switched on by a predetermined voltage being applied to the gate terminals 45.

Also, the drain terminals 44 of the FETs 4 are connected to the input bus bar 14 via the first conductive portions 24 and the first conductive pieces 5. The source terminals 46 of the FETs 4 are connected to the output bus bar 15 via the second conductive portions 25 and the second conductive pieces 6.

Accordingly, if the FETs 4 are switched on by the input of a signal from the control board 3, power supplied from the input terminal 14*a* is output from the output terminal 15*a* via the output bus bar 15 via the first conductive portions 24, the first conductive pieces 5, the drain terminals 44, source terminals 46 of the FETs 4, the second conductive portions 25, and the second conductive pieces 6. In this way, power is supplied from the power source to the load via the electrical junction box 1.

If the FETs 4 are switched off by the input of a signal from the control board 3, the drain terminals 44 and source terminals 46 of the FETs 4 are not made conductive with each other, and the supply of power from the power source to the load is stopped.

With the configuration described above, the FETs 4 electrically connect to the input bus bar 14 and the output bus bar 15 via the first conductive portions 24 and the first conductive pieces 5 of the circuit board 2, or via the second conductive portions 25 and the second conductive pieces 6 of the circuit board 2, thus enabling connection without narrowing the gap between the input bus bar 14 and the output bus bar 15, in relation to the gaps between the terminals of the FETs 4. Thus, the FETs 4 can easily be installed in the electrical junction box even if the spaces between the terminals of the FETs 4 are narrow. Accordingly, it is possible to easily install the FETs 4 in the electrical junction box 1.

Also, using the first conductive pieces 5 and the second conductive pieces 6 makes it possible to reduce the conduction distance to the first conductive portions 24 and the second conductive portions 25 of the circuit board 2, and decrease the resistance value of the conduction path. Also, by directly soldering the first conductive pieces 5 and the second conductive pieces 6, it is possible to increase thermal conductivity to the input bus bar 14 and the output bus bar 15, and to suppress localized increases in temperature. Also, it is possible to increase resistance to stress and suppress cracking of the solder more so than connecting the first conductive portions 24 and the second conductive portions 25 to the input bus bar 14 and the output bus bar 15 with solder alone, and it is also possible to use the electrical junction box 1 over a longer period of time.

The embodiments disclosed herein are illustrative in all respects and should not be considered restrictive. The scope of the disclosure is indicated by the claims, not by the meanings described above, and is intended to include all changes within the meaning and scope of the claims that are equal to the claims.

The invention claimed is:

1. An electrical junction box, comprising:
   bus bars;
   a circuit board of which one side opposes the bus bars;
   a conductive portion that is provided on the one side of the circuit board, and is exposed from the other side of the circuit board;
   an opening that is provided in parallel with the conductive portion in the circuit board, and from which a portion of the bus bars is exposed;
   a switching element that is arranged on the other side of the circuit board, and of which an input terminal or an output terminal is connected to the conductive portion;
   a conductive piece that is disposed in the opening and arranged straddling a portion of the bus bars and the conductive portion.

2. The electrical junction box according to claim 1, wherein:
   the conductive portion, the opening, and the conductive piece are each provided in pairs corresponding to the input terminal and the output terminal of the switching element;
   the bus bars include an input bus bar into which power can be input, and an output bus bar from which power is outputted;
   the input terminal of the switching element is electrically connected to the input bus bar; and
   the output terminal of the switching element is electrically connected to the output bus bar.

3. The electrical junction box according to claim 1, further comprising an adhesive sheet that is arranged between the circuit board and the bus bars, and that adheres the circuit board and the bus bars to each other.

4. The electrical junction box according to claim 1, wherein the conductive piece is connected to the portion of the bus bar and the conductive portion through soldering.

5. The electrical junction box according to claim 2, further comprising an adhesive sheet that is arranged between the circuit board and the bus bars, and that adheres the circuit board and the bus bars to each other.

6. The electrical junction box according to claim 2, wherein the conductive piece is connected to the portion of the bus bar and the conductive portion through soldering.

7. The electrical junction box according to claim 3, wherein the conductive piece is connected to the portion of the bus bar and the conductive portion through soldering.

8. The electrical junction box according to claim 3, wherein the conductive piece is connected to the portion of the bus bar and the conductive portion through soldering; and
   wherein:
   the conductive portion, the opening, and the conductive piece are each provided in pairs corresponding to the input terminal and the output terminal of the switching element;
   the bus bars include an input bus bar into which power can be input, and an output bus bar from which power is outputted;
   the input terminal of the switching element is electrically connected to the input bus bar; and
   the output terminal of the switching element is electrically connected to the output bus bar.

* * * * *